US005453583A

United States Patent [19]
Rostoker et al.

[11] Patent Number: 5,453,583
[45] Date of Patent: Sep. 26, 1995

[54] INTERIOR BOND PAD ARRANGEMENTS FOR ALLEVIATING THERMAL STRESSES

[75] Inventors: Michael D. Rostoker, San Jose; Nicholas F. Pasch, Pacifica; Joe Zelayeta, Saratoga, all of Calif.

[73] Assignee: LSI Logic Corporation, Milpitas, Calif.

[21] Appl. No.: 58,117

[22] Filed: May 5, 1993

[51] Int. Cl.[6] .................................................. H05K 1/00
[52] U.S. Cl. .......................... 174/267; 174/260; 361/774; 361/777
[58] Field of Search ................................... 174/260, 267; 361/767, 772, 774, 777, 779; 228/179; 257/666, 670, 671

[56] References Cited

U.S. PATENT DOCUMENTS

| | | | |
|---|---|---|---|
| 3,429,040 | 2/1969 | Miller | 29/626 |
| 3,811,186 | 5/1974 | Larnerd et al. | 29/626 |
| 3,871,014 | 3/1975 | King et al. | 357/67 |
| 3,984,860 | 10/1976 | Logue | 357/68 |
| 4,190,855 | 2/1980 | Inoue | 357/80 |
| 4,701,999 | 10/1987 | Palmer | 437/211 |
| 4,772,936 | 9/1988 | Reding et al. | 357/80 |
| 4,774,635 | 9/1988 | Greenberg et al. | 361/421 |
| 4,803,546 | 2/1989 | Sugimoto et al. | 357/81 |
| 4,825,284 | 4/1989 | Soga et al. | 357/80 |
| 4,894,704 | 1/1990 | Endo | 357/70 |
| 4,897,602 | 1/1990 | Lin et al. | 324/158 F |
| 4,926,241 | 5/1990 | Carey | 357/75 |
| 4,970,575 | 11/1990 | Soga et al. | 357/72 |
| 5,051,813 | 9/1991 | Schneider et al. | 357/72 |

FOREIGN PATENT DOCUMENTS 61-145838(A)  7/1986  Japan .......................... 21/60

Primary Examiner—Leo P. Picard
Assistant Examiner—Cheryl R. Figlin

[57] ABSTRACT

A technique for reducing thermally-induced mechanical stresses on bond pads in semiconductor device assemblies is accomplished by grouping the bond pads into a relatively small (compared to the total area of the die) sub-area within an interior area (generally away from the periphery) of the die. By keeping the bond pad layout small (tightly grouped, or oriented along a single row, or axis), differential thermally induced displacements between the bond pads are minimized, or are controlled in one dimension. Further, the bond pads may be disposed in a small area near the center of thermal expansion (centroid) of the die or near a heat-producing circuit element to minimize absolute thermal displacements of individual bond pads from the centroid or the circuit element. Overlapping sub-area patterns may be used, and grouped bond pads may be used in conjunction with (including overlapping of) traditional die-periphery located bond pads. Other aspects involve disposing the bond pads into an elongated pattern to minimize thermal displacement primarily in one direction, and orienting a lead frame or the like to accommodate any thermal migration of the bond pads in a controlled direction.

24 Claims, 3 Drawing Sheets

INTERIOR BOND PAD ARRANGEMENTS FOR ALLEVIATING THERMAL STRESSES

TECHNICAL FIELD OF THE INVENTION

The invention relates to integrated circuit fabrication techniques, and more particularly to techniques for forming electrical connections with an integrated circuit die.

BACKGROUND OF THE INVENTION

As used herein, the term "semiconductor device" refers to discrete or integrated circuit devices such as a silicon chip or die containing circuitry, and the term "semiconductor device package" refers to the associated packaging generally used for containing the semiconductor device (e.g., chip), including leads such as for connecting to a socket or a circuit board, and internal connections, such as bond wires or solder bump (micro-bump) connections, of the die to the leads.

In a typical modern semiconductor device package, a semiconductor die (device) is disposed within a package and is connected to conductive leads of the semiconductor device package by means of bond wires or "solder bump" (micro-bump) connections. The connections to the semiconductor die are typically accomplished via metallic connection points or "bond pads" (I/O pads) disposed on a planar surface of the die, around the periphery (along the edges) thereof in a "peripheral area". The peripheral area is a ring-shaped area on the surface of the die, essentially a narrow band between the edges of the die and the "interior area" of the die. The conductive leads of the semiconductor device package may be provided by a leadframe, such as in a molded plastic or TAB (Tape Automated Bonding) semiconductor device package, or by printed traces, such as in a ceramic or overmolded printed circuit board package. The conductive leads approach the semiconductor die within the semiconductor device package in a generally radial ("fan-in") pattern.

Typically, a leadframe is stamped (or etched) from a sheet of conductive material, simultaneously forming all of the conductive leads of the leadframe. Often, the leadframe is held together by sacrificial "bridges" between the leads, which are removed after the leadframe is assembled to a die and a package body is formed. The leads are then effectively separate. However, by virtue of their common mounting within a package body, they continue to behave as a unit. Alternatively, the leads can be formed on a non-conductive substrate, such as mylar, to form a tape automated bonding (TAB) packaged chip.

As the circuitry on a die operates, it dissipates power and heats up. Often, there is a mismatch between the thermal coefficients of expansion (TCE) of a semiconductor die and the leadframe (and package body) to which it is attached. This is especially troublesome where solder bump (micro-bump) connections are used to connect the die to the leadframe. (It is assumed that the heating of the die as it operates is fairly uniform). Generally, as temperature rises, the die expands about its "centroid" (center of mass) or around a circuit element that produces heat, as do the leadframe and package body. However, the die expands at a different rate than the leadframe and package body, causing a great deal of mechanical stress at the interface between the leadframe and the bond pads (the solder bump connections). This stress creates a tendency of the bond pads to tear away from the die, resulting in a failed device.

On any thermally expanding body, the further a point on the body is from the centroid, the greater the absolute distance it travels (displaces) during expansion. Since semiconductor dies are typically rectangularly shaped and the bond pads are typically disposed along the edges of the rectangular shape (in the peripheral area), the bond pads undergo a fairly large absolute displacement as compared to points located closer to the center (centroid) of the die. Any bond pads located at the corners of the die, being furthest from the centroid, undergo the greatest displacement during thermal expansion. As a consequence of the absolute thermal displacements that any two different points undergo on the surface of the die, they undergo differential thermal displacements relative to one another. The further from one another that any two points on the surface of an expanding die are, the greater the differential thermal displacement between them. The leadframe and package body combination also expands about its centroid, albeit at a different rate. The center of expansion of the leadframe/package body combination is generally located fairly close to the centroid of the die, since the die is the heat source which causes the expansion. As a result, any differential thermal displacement causing mechanical stress at the bond pads of a semiconductor device-is greatest at the corners of the die. The common practice of disposing bond pads along the edges of the die, therefore, would seem to create the worst possible circumstances from the point of view of thermal expansion.

Although the thermal expansion problem is most severe with micro-bump (solder bump) connections to a relatively rigid leadframe assembly, the same expansion characteristics apply to the die and leadframe/package body even if bond wires are used to connect the bond pads on the die to the leadframe. Although bond wires tend to be considerably more flexible and resilient than lead frame leads, thermal flexing of bond wire connections can create long-term reliability problems. Other conductive attachments, such as tab (e.g., TAB), non-solder conductive bumps/contacts, et cetera, exhibit similar problems.

One of the most common and compelling reasons that bond pads are typically disposed about the edges (periphery) of a die is that the peripheral location permits a relatively large number of connections to the die without causing connections to cross one another. Current trends are towards, providing smaller bond pads so that even greater numbers of connections to the die may be accommodated. Unfortunately, the smaller connections are even more fragile than "ordinary" (larger) size connections, making such techniques even more prone to thermal stress problems.

Another problem with locating bond pads along the periphery of a die is that many of the connections are made to circuitry that lies well within the interior of the die, requiring that the signals from that circuitry travel a relatively great distance within the die along the die's minute wiring structures (e.g., metal lines) before they reach the bond pad connection. Hence, a "pad buffer" circuit is usually provided at or near a bond pad associated with an output signal to buffer the output signal at the bond pad. The length of conductive lines within the die can contribute to timing "skew", or differences in signal timing due to different wiring delays, particularly for very high speed circuits. The conductive lines within a die are extremely small and exhibit some non-trivial resistance. Even a tiny bond wire is a massive conductor compared to the relatively tiny conductive lines on a die.

Attention is directed to the following U.S. Patents, incorporated herein by reference, and of general interest with respect to leadframe-type semiconductor device packages and techniques for the manufacture thereof: U.S. Pat. Nos. 4,701,999 issued Oct. 27, 1987 to Palmer, 4,774,635 issued Sep. 27, 1988 to Greenberg et al., 4,894,704 issued Jan. 16, 1990 to Endo, 4,897,602 issued Jan. 30, 1990 to Lin et al., and 5,051, 813 issued Sep. 24, 1991 to Schneider et al.

Attention is further directed to the following U.S. Patents, incorporated herein by reference, and of general interest with respect to micro-bump (e.g., solder bump) bonding: U.S. Pat. Nos. 3,429,040 issued Feb. 25, 1969 to Miller, 3,811,186 issued May 21, 1974 to Larnerd et al., 3,871,014 issued Mar. 11, 1975 to King et al., 3,984,860 issued Oct. 5, 1976 to Logue, 4,190,855 issued Feb. 26, 1980 to Inoue, 4,772,936 issued Sep. 20, 1988 to Reding et al., 4,803,546 issued Feb. 7, 1989 to Sugimoto et al., 4,825,284 issued Apr. 25, 1989 to Soga et al., 4,926,241 issued May 15, 1990 to Carey, and 4,970,575 issued Nov. 13, 1990 to Soga et al.

Additional information relating to microbump bonding techniques may be found in Japanese Patent number 61-145838A issued on Jul. 3, 1986 to Kishio Yokouchi, and in "LED Array Modules by New Technology Microbump Bonding Method," by Hatada, Fujimoto, Ochi, and Ishida, IEEE Trans. Comp., Hybrids, and Manuf. Tech., Volume 13 no. 3, Sept. 1990, incorporated by reference herein.

DISCLOSURE OF THE INVENTION

It is therefore an object of the present invention to provide a technique for minimizing thermally created stresses at bond pad interfaces to semiconductor dies.

It is a further object of the present invention to provide a technique for minimizing the absolute thermal displacement of bond pads on a semiconductor die.

It is a further object of the present invention to minimize differential thermal displacements between bond pads on a semiconductor die.

It is a further object of the present invention to provide a technique for improving connections to signals originating within the interior area (away from the periphery) of a semiconductor die.

It is a further object of the present invention to provide novel techniques for connecting to semiconductor dies.

According to the invention, it is posited that differential thermal displacements between points on a body due to thermal expansion of the body are proportional to the distance between the points. It is further posited that the absolute thermal displacement of a point on a body relative to the thermal center of expansion is proportional to the distance between the point and the thermal center of expansion. Also, if two bodies have different thermal coefficients of expansion and are thermally coupled at a point near their respective centroids, then differential thermal displacement and absolute thermal displacements between points on the different bodies will behave similarly, albeit on a different scale (depending on the various coefficients of thermal expansion of the two bodies).

According to the invention, differential thermal displacements of bond pads on a die (either relative to one another or relative to corresponding conductive leads of a leadframe) are minimized by defining a small, closed, sub-area enclosed by a single boundary on the surface of the die, and disposing the bond pads exclusively within the closed sub-area of the die. (A "closed" area is one which is defined by a single boundary having no endpoints, e.g., a circle, ellipse, polygon, etc..)

According to one aspect of the invention, the sub-area has an area of less than a $1/n^{th}$ portion of the total area of die (i.e., of a planar surface of the die), where n is, for example, 2, 3, 4, 5, . . . 50, . . . 100.

According to an embodiment of the invention, a ring-like peripheral area on a planar surface of the die is defined along the edges of the planar surface. Such a peripheral area has two boundaries—one of the boundaries being the edges of the die. The peripheral area encloses an interior area of the die on the planar surface. A first plurality of bond pads is disposed on the die in a portion of the entire peripheral area, and a second plurality of bond pads is disposed in the interior area of the die in close proximity to the portion of the peripheral area. The first and the second pluralities of bond pads are enclosed within a small, closed sub-area of the die defined by a single boundary.

According to another embodiment of the invention, the bond pads are disposed in a small, closed sub-area which is located entirely within the interior area of the die (i.e., away from the peripheral area).

According to an aspect of the invention, the small, closed sub-area has an elongated shape, and the bond pads are disposed in two parallel rows along a longitudinal dimension of the elongated area.

The following aspects and embodiments are directed to semiconductor device assemblies (packaged devices) formed according to the techniques described hereinabove.

In one embodiment, a semiconductor device assembly comprises a package body, a leadframe within the package body including a plurality of conductive leads and a semiconductor die. A small, closed sub-area of the die is defined on the planar surface of the die and is enclosed by a single boundary. The sub-area has an area enclosed by the boundary which is substantially smaller (e.g., $1/n^{th}$ portion, e.g., where n is, e.g., 2, 3, 4, 5, . . . 50, . . . 100) than the total area of the die. Bond pads are disposed exclusively in the sub-area so that the bond pads are sufficiently close together to minimize (differential) thermal displacement of any given bond pad relative to any other bond pad. An electrical connection is formed between each of individual ones of the conductive leads and a corresponding bond pad.

According to an embodiment of the invention, the electrical connection to the die is effected by a bond wire.

According to another embodiment of the invention, the electrical connection to the die is effected by bump-type connections, such as solder bumps (raised micro-bump connection).

In another embodiment of the invention, a ring-like peripheral area of the die is defined on a planar surface of the die along the edges of the die. An interior area of the die is defined on the planar surface, enclosed by the peripheral area. A first plurality of bond pads is disposed in a portion, such as a corner, of the peripheral area of the die, and a second plurality of bond pads is disposed in the interior area. The first and the second pluralities of bond pads are enclosed within a small, closed sub-area of the die. The sub-area has an area which is substantially less than (e.g., a $1/n^{th}$ portion, where n is, e.g., 2, 3, 4, 5 . . . 50, . . . 100) the total area of the die.

In another embodiment of the invention, a ring-like peripheral area of the die is defined on the planar surface along the edges of the die. An interior area of the die defined on the planar surface, and is within the peripheral area. The bond pads are disposed in a small, closed sub-area is completely contained within the interior area of the die.

In another embodiment of the invention, the bond pads are disposed in a small, closed sub-area, which is an elongated area, and the bond pads are disposed in two parallel rows along a longitudinal dimension of the elongated area.

In another embodiment of the invention, a plurality of bond pads are disposed along a straight line (single row of bond pads), and are substantially laterally centered on the die. The bond pads include a first and a second group of bond pads. The first group and second group of bond pads are arranged in an alternating (interleaved) order along the straight line. A leadframe includes a corresponding first group and a corresponding second group of conductive leads. The first group of conductive leads approaches the first group of bond pads from one side of the straight line, extending from one edge of the die partially across the planar surface of the die and just over the first group of bond pads. Each of the first group of conductive lines is connected to a corresponding one of the first group of bond pads via a raised micro-bump connection, or the like. In a similar manner, the second group of conductive leads approaches the second group of bond pads from the opposite side of the straight line, extending from an opposite edge of the die partially across the planar surface and just over the second group of bond pads. Each of the second group of conductive lines are connected to a corresponding one of the second group of bond pads via a raised micro-bump connection, or the like.

In another embodiment, combinations of patterns of bond pads are disposed on the die, for example on the die periphery and an interior area of the die. Also, such patterns may overlap, providing specific bond pads being part of more than one pattern.

According to the invention, by placing bond pads in positions where differential thermal displacements are either reduced, minimized, or eliminated, the corresponding thermally induced stresses are reduced, minimized or eliminated.

Further, according to the invention, if circuits on a semiconductor die are located distant from the desired "interior" bond pad locations (i.e., signals originate outside the small, closed area where it is sought to locate the bond pads), existing and/or extra wiring (metallization) layers may be employed to provide connection between these circuits and bond pads at the desired locations. This is particularly useful in applying the present inventive technique to semiconductor dies which were originally laid out for bond pads in the peripheral area. Existing and/or additional wiring layers may be employed to route signals from the original (designed) bond pad positions to the desired (according to the inventive technique) interior bond pad positions.

Other objects, features and advantages of the invention will become apparent in light of the following description thereof.

DETAILED DESCRIPTION OF THE INVENTION

According to the invention, it is posited that if an array of bond pads on a semiconductor die is tightly (closely) grouped (arranged or clustered), then the amount of differential thermal expansion between those bond pads will be correspondingly small, and that if the small array of bond pads is located close to the centroid of the die, then the absolute thermal displacement of the bond pads will be correspondingly small.

Similarly, if the ends of the conductive leads of a mounted leadframe form a small (tightly clustered) pattern, the differential thermal displacement of the ends of the leads will be correspondingly small. Also, if the small pattern formed by the ends of the conductive leads is located close to the center of expansion of the leadframe, then the absolute thermal displacement of the ends of the conductive leads will be correspondingly small. According to the invention, these principles may be used to surprising (and somewhat non-intuitive) advantage in the design packaging of semiconductor dies.

While the industry trend is largely towards increasing the number of connections to a semiconductor die, certain types of semiconductor devices, despite great complexity, do not require large numbers of I/O connections. An example of an I/O non-intensive type of semiconductor device is any type of memory device (e.g., ROMs, RAMs, including dynamic RAM and static RAM, etc.). Memory devices are highly repetitive arrays of circuitry with a relatively small number of I/O connections thereto. In cases such as these, there is no compelling need to employ the large bond pad capacity of the periphery of the die. In fact, according to the invention, it is extremely advantageous (from a thermal expansion point of view) to locate the bond pads in a relatively small array, preferably, but not necessarily, towards the centroid of the die—in any case away from the periphery of the die.

Occasionally, a particular heat-generating circuit or circuit element located away from the centroid of the die dominates the thermal characteristics of the die, thereby causing thermal expansion of the die to be centered about the centroid of the circuit or circuit element. Often, such a circuit or circuit element (e.g., an embedded microprocessor) will necessitate the placement of bond pads around the heat generating circuit or circuit element (generally about the centroid of the circuit), rather than about the centroid of the die.

Figure 1A:
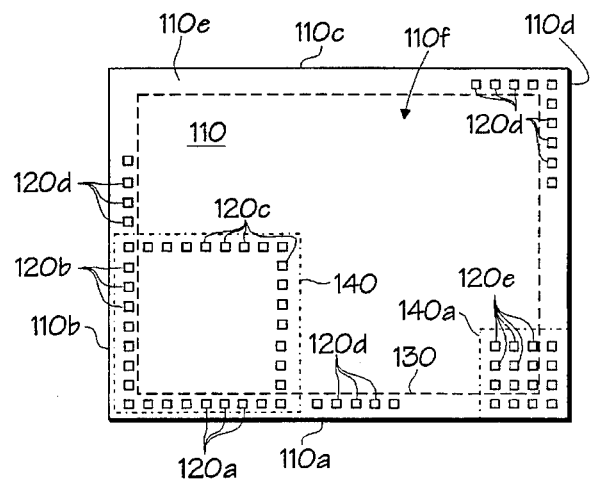
FIGS. 1a and 1b are top-(plan) views of semiconductor dies, each with an array of bond pads, a portion of which are interior bond pads, according to the invention.

FIG. 1a is a top view of a semiconductor die 110. By way of example, four edges 110a, 110b, 110c, and 110d of the die are indicated. A first dashed line 130 divides the area of the die 110 into an interior area 110f and a peripheral area 110e. The peripheral area 110e is a ring-like area along the edges of the die 110, within which bond pads are "traditionally" disposed (as shown at 120d). The ring-like peripheral area is defined by two separate boundaries; the edges 110a, 110b, 110c, and 110d of the die, and the line 130 forming the boundary of the interior area 110f. The interior area 110f lies inside of the peripheral area, and includes the center (centroid) of the die. Ordinarily, bond pads are not disposed within the interior area 110f.

A second dashed line defines a small, closed area 140 within the planar surface of the die 110 In this context, "small" means substantially smaller than the area of the die, i.e., less than a $1/n^{th}$ portion of the total area of the die, where "n" is, for example, 2, 3, 4, 5, . . . 10, . . . 50, . . . 100. "Closed" means that the area is defined by a single, unbroken boundary (e.g., 140). (This is in marked contrast to the peripheral area 110e, which is defined by two boundaries.) In this case, a portion of the small, closed area 140 lies along two adjacent edges 110a and 110b of the die. As shown in the Figure, the small, closed area is substantially rectangular, and has bond pads disposed along its periphery (i.e., the periphery of the small, closed area 140). Note that this "periphery" is not the same as the peripheral area 110e of the die 110 in that a substantial portion of the periphery of the small closed area lies in the interior area 110f of the die 110.

A first plurality of bond pads 120a (nine shown, can be many more), are disposed within the small closed area 140 along one edge 110a of the die 110, within the peripheral area 110e. A second plurality of bond pads 120b (nine shown, can be many more) are disposed within the small closed area 140 along one edge 110b of the die 110, within the peripheral area 110e. A third plurality of bond pads 120c (fifteen shown, can be more) are disposed within the small closed area defined by the boundary 140 along the periphery thereof, entirely within the interior area 110f of the die 110.

The location of the bond pads 120a, 120b, and 120c within the small closed area 140, rather than completely within the peripheral area 110e, minimizes differential thermal displacement of the bond pads 120a, 120b, and 120c, relative to one another. Further, the small closed area 140 may be positioned such that the third bond pads 120c are close to the (underlying) circuitry to which they connect. This minimizes the on-chip distance travelled by signals to reach these bond pads 120c, thereby minimizing signal delays.

As shown, two sets of bond pads, 120a and 120b, are located within the peripheral area 110e. This illustrates that it is not essential, according to the invention, that all of the bond pads lie within the interior area 110f. It is only essential that at least a portion of the bond pads (e.g., 120c) lie within the interior area 110f.

Similarly, a small, closed area 140a may include bond pads within the peripheral area 110e and bond pads 120e within the periphery of the small, closed area 140a.

Figure 1B:
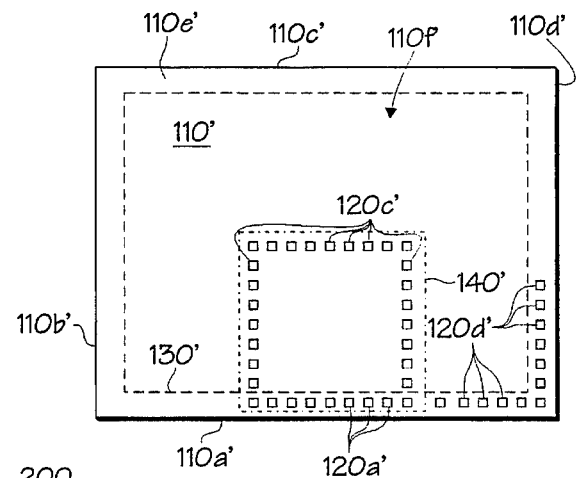

The small, closed area shown in FIG. 1a lies substantially in a corner of the die 110. FIG. 1b, shows a similar die 110' having four edges 110a' 110b' 110c' and 110d' and a boundary 130' defining a peripheral area 110e' and an interior area 110f'. A single, unbroken boundary 140' defines a small, closed sub-area of the die 110'. Bond pads 120a' (nine shown) and 120c' are disposed within the small, closed sub-area such that bond pads 120a' lie within a portion of the peripheral area 110e' along an edge 110a' of the die, and the bond pads 120c' all lie within the interior area 110f'. In this case, the small, closed area is located along the edge 110a' of the die 110' but away from the corner.

Figure 2:
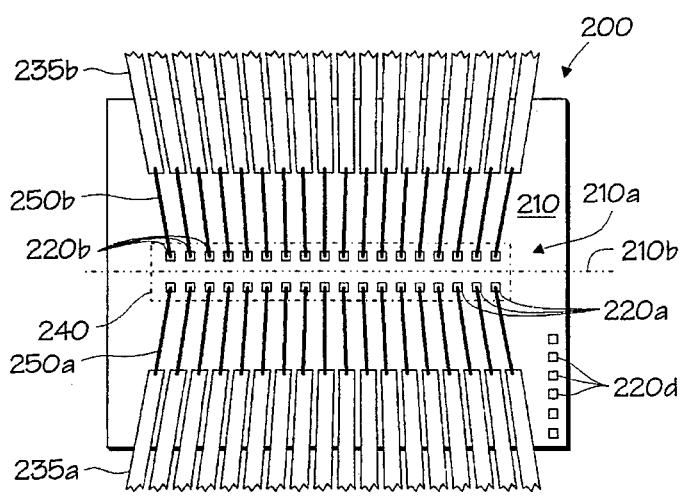
FIG. 2 is a top view of a semiconductor die and leadframe assembly, according to an alternate embodiment of the invention.

FIG. 2 is a view of an assembly 200 of a die 210 and leadframe (having a first group of conductive leads 235a and second group of conductive leads 235b). A small, elongated, closed area 240 is defined within an interior area 210a of the die. The small elongated area 240 is situated within a percentage within "x" percent of a lateral dimension of the die as measured from a centerline 210b of the die 210 (where "x" is, e.g., 5% 10% 15% 20%, 25%, 30%). Two parallel rows of first and second bond pads 220a (eighteen shown, can be more) and 220b (eighteen shown, can be more), respectively, are disposed within the small, elongated, closed area 240 such that they extend along the long dimension of (longitudinally across) the elongated area 240. The two rows are situated (spaced) a distance less than "y" apart from one another, where "y" is, e.g., 5%, 10%, 15%, 20%, 25%, 30% of the total distance across the die. First conductive leads 235a (one indicated), approaching the row of first bond pads 220a, extend from one edge of the die partially over the interior area 210a of the die 210, and are connected to the first bond pads 220a via corresponding first bond wires 250a. Second conductive leads 235b (one indicated), approaching the row of second bond pads 220b (from the opposite side of the die 210), also extend partially over the interior area 210a of the die 210, and are connected to the second bond pads 220b via second bond wires 250b.

Additionally, as with all embodiments of the present invention, traditional bond pads 220d may be located on the die 210 along a portion or all of its periphery.

This configuration of first and second bond pads 220a and 220b, respectively, exhibits minimal tendency of the rows of bond pads to move apart from one another in thermal displacement. The greatest thermal displacement of the bond pads 220a and 220b is along the lengths (longitudinal dimensions) of their respective rows. However, the bond wires 250a and 250b have relatively good flexibility in the lateral direction (i.e., essentially perpendicular to their length and parallel to the rows of bond pads), which means that any lateral motion (relative to the bond wires, corresponding to the motion in the longitudinal dimension of the rows of bond pads) of the bond pads 220a or 220b will be accommodated by (and distributed along) a substantial portion of the length of the bond wire. On the other hand, the bond wires 250a and 250b have less (relatively poor) flexibility in their longitudinal direction (corresponding to bond pad motion tending to separate the rows of bond pads), which would tend to "compress" or "stretch" the bond wires along their length. Unless there is significant "loft" in the path of the bond wires, they tend to be more stiff in the longitudinal dimension. (If the bond wires are disposed in a significant high "loft" or vertical arc, then there is significant danger of shorting between the bond wires if they should bend; not a desirable condition.) By organizing the bond pads such that their thermal expansion (displacement) is oriented to be accommodated by lateral flexing rather than compression of the bond wires, stresses on the bond pads and interconnections are minimized.

Figure 3A:
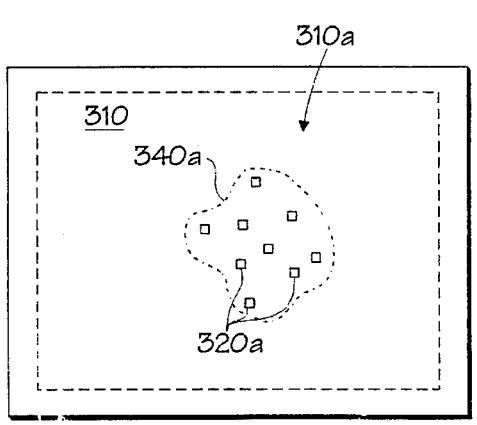
FIGS. 3a and 3b are top views of semiconductor dies with interior bond pads, according to another embodiment of the invention.
Figure 3B:
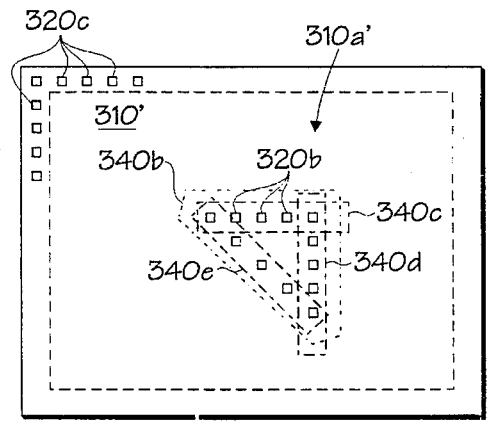

FIGS. 3a and 3b are top view of embodiments of a semiconductor device incorporating interior bond pads, according to alternate embodiments of the invention. In both embodiments, bond pads are clustered in a small, closed sub-area well within an interior area of a planar surface of the die.

FIG. 3a shows a small, closed area (sub-area) 340a defined within an interior area 310a of a semiconductor die 310. Bond pads 320a (nine shown, can be more) within this area are disposed in a relatively random configuration which is clearly not along the periphery of the sub-area 340a. This orientation of the bond pads 320a corresponds to ideal positioning of the bond pads 320a relative to underlying circuitry (not shown) to which they are connected. (Generally speaking, the "ideal position" of a bond pad is a location in close proximity to the circuit to which it is connected— often directly above a circuit element generating or receiving a signal to/from the bond pad).

FIG. 3b, shows a similar small, closed area 340b defined within an interior area 310a' of a semiconductor die 310'. Within the small, closed area 340b, bond pads 320b (twelve shown, can be more) are disposed in a patterned configuration having some regularity. In this example, the pattern is a triangle, and the bond pads are disposed towards the periphery of the small, closed sub-area 340b. However, the bond pads 320b can be considered to be within three partially overlapping rectangular closed sub-areas 340c, 340d, and 340e (each sub-area having five bond pads 320b, as shown). Traditional bond pads 320c may lie along the die periphery.

By locating the bond pads 320a (FIG. 3a) and 320b (FIG. 3b) in small, closed areas 340a and 340b, respectively, differential thermal displacement between the bond pads within each area is reduced significantly over the displacement which would be experienced in bond pad placement at the die periphery. Further, since both areas are located well within the interior areas of their respective dies, absolute thermal displacement of the bond pads 320a and 320b is reduced over that which would be experienced at the die periphery.

Figure 4:
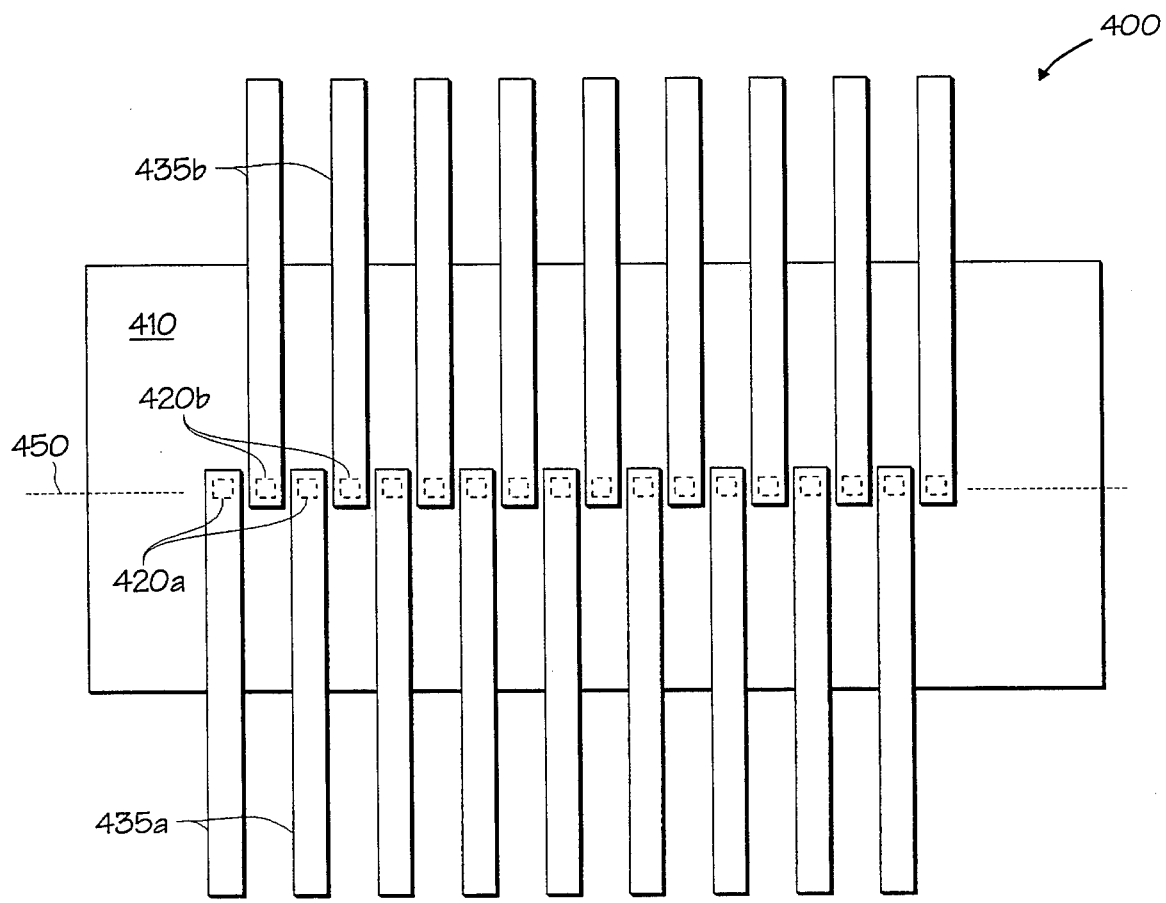
FIG. 4 is a top view of an alternate embodiment of a semiconductor die and leadframe assembly, according to another embodiment of the invention.

FIG. 4 is a top view of an assembly 400 of a semiconductor die 410 to a leadframe (composed of a group of first conductive leads 435a and a group of second conductive leads 435b). Bond pads 420a and 420b are disposed in a linear configuration (e.g., in a single row) on the surface of the die 410 along a line 450. The line is at or near the centerline of the die (compare FIG. 2).

A first group of bond pads 420a is arranged in an alternating configuration (interleaved) with a second group of bond pads 420b along the line 450 (by way of analogy, "boy-girl-boy-girl"). The first group of conductive leads 435a approaches the first group of bond pads 420a from a first direction (from one edge of the die), each conductive lead 435a extending partially across the surface of the die 410, to a corresponding first bond pad 420a, and connecting to the bond pad 420a via a direct solder (e.g., raised solder bump) connection. The second group of conductive leads 435b approaches the second group of bond pads 420b from a second direction (from an opposite edge of the die) opposite the first direction, and are offset from the second conductive leads 435b such that they form an interleaved configuration with the first group of conductive leads 435a to the line of bond pads. Each of the second group of conductive leads 435b connect to corresponding ones of the second group of bond pads 420b by means of raised solder bump connections. Evidently, since the bond pads 420a and 420b are in a row (single file), the ends of the leads 435a and 435b are offset along the row.

In a manner similar to that described hereinabove with respect to bond wires (compare FIG. 2), the conductive leads (435a and 435b) are considerably more flexible (end motion) in the lateral direction than in their longitudinal direction. In fact, the conductive leads of a leadframe (e.g., 435a and 435b) are typically extremely stiff in the longitudinal dimension. Assuming that the leadframe and the die 410 are affixed to one another such that they have a substantially common center of thermal expansion (centroid) and that the line (450) along which the bond pads (420a and 420b) are disposed passes over (through) the centroid (or the centroid of a circuit element, not shown), the linear configuration of bond pads exhibits substantially zero displacement in the longitudinal dimension of the conductive leads (435a and 435b), effectively eliminating thermally induced stresses at the bond pads (420a and 420b) in that direction. Thermal migration of the bond pads along the line 450 is relatively easily accommodated by lateral flexing of the lead frame leads 435a and 435b.

Figure 5A:
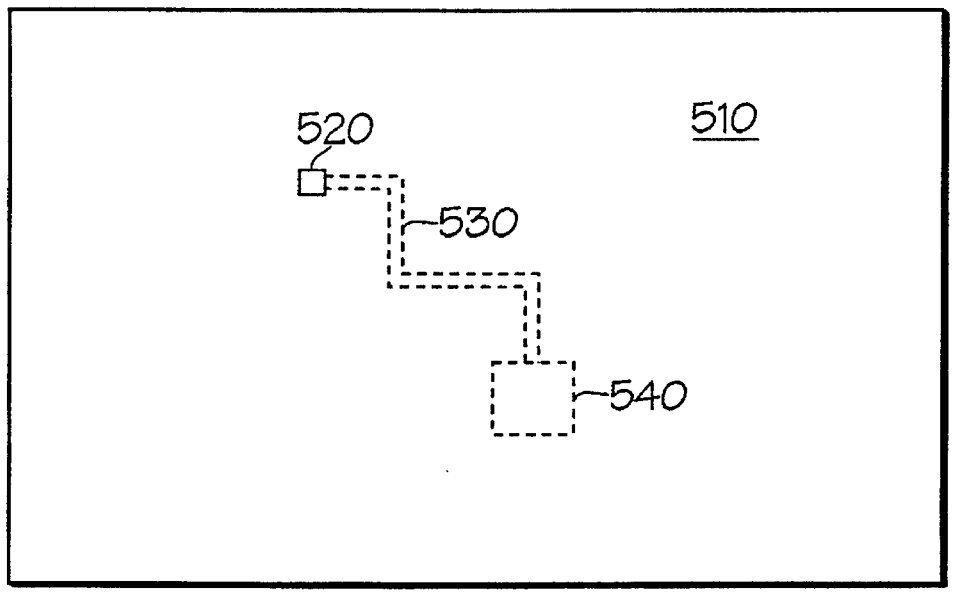
FIG. 5a is a top view of a semiconductor die showing the use of an internal (underlying the surface) wiring layer connecting a circuit to an interior bond pad, according to the invention.

FIG. 5a is a top view of a semiconductor die 510 illustrating an exemplary "interior" bond pad 520 (i.e., a bond pad in a small, closed sub-area of the die, according to any of the embodiments of the present invention) to which a circuit element 540 on the die is to be connected. A conductive wiring path 530 in one or more sub-surface wiring layers of the die 510 establishes a connection (e.g., signal, ground, or power path) between the circuit element 540 and the bond pad 520. In this FIG. 5a, the locations of the bond pad 520 and the circuit 540 are representative of situations where a circuit 540 is not located close to the desired position of a bond pad 520 to which it must connect.

Figure 5B:
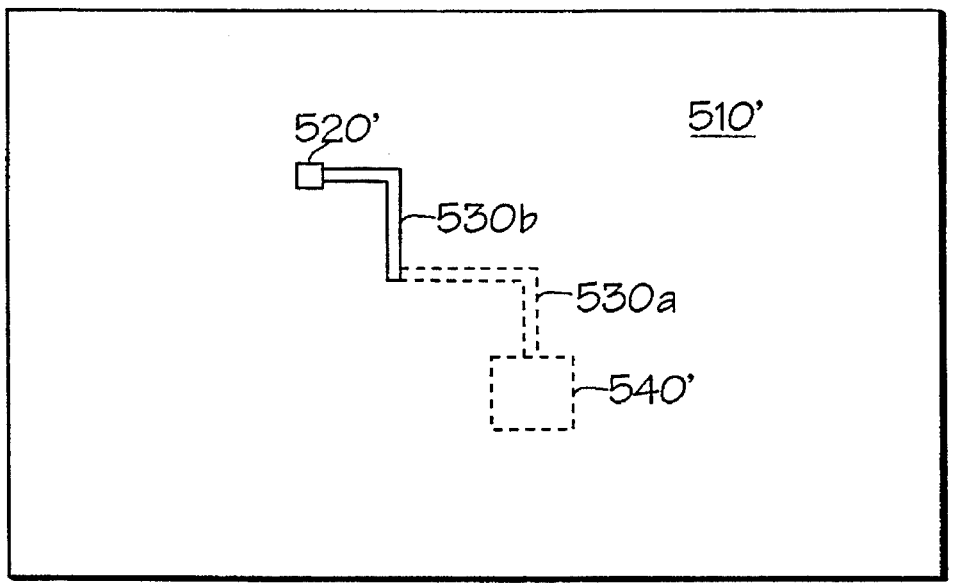
FIG. 5b is a top view of a semiconductor die showing the use of an overlying wiring layer connecting a circuit to an interior bond pad, according to the invention.

FIG. 5b is a top view of a semiconductor die 510' (similar to 510) with an interior bond pad 520' to which a circuit element 540' on the die 510' is to be connected. A conductive wiring path between the circuit element 540' and the bond pad 520' comprises a sub-surface portion 530a in an interior wiring layer and a top-surface portion 530b on the top surface of the die.

FIGS. 5a and 5b illustrate that connections between circuits and bond pads (both being on the die) may be accomplished by means of either existing or additional wiring layers, either within the die (under the surface of the die) or on the surface of the die.

This is particularly advantageous in circumstances where either:

a) the design of the circuitry on the die was optimized for bond pad placement at the periphery of the die, and rerouting of existing signals is necessary to apply the present inventive techniques; or b) the circuitry on the die cannot be laid out optimally for the desired interior bond pad locations (of the present invention) and it is necessary to route signals to bond pads from relatively distant positions on the die.

It is within the spirit and scope of the present invention that any of the techniques described hereinabove may be used in combination. For example, the double-row configuration shown and described with respect to FIG. 2 and connected with bond wires could equally well be accomplished by extending the conductive leads over the bond pads and forming raised bump contacts, in a manner similar to that described hereinabove with respect to FIG. 4.

Further, these techniques may be applied to raised bump mounting to printed traces on printed circuit substrates (e.g., FR4, BT resin, etc.), or other substrates, in a flip-chip configuration. Such printed circuit boards often have a thermal coefficient of expansion significantly different from that of silicon. Evidently, interior bond pads can be used to great advantage in these circumstances.

What is claimed is:

1. Method of laying out bond pads on a semiconductor die, comprising:

providing a semiconductor die having a total area, a substantially planar surface, and edges of the planar surface;

defining on the planar surface, within a single boundary, a small, closed sub-area of the die having an area enclosed by the boundary which is substantially smaller than the total area of the die; and providing bond pads in the sub-area so that the bond pads are sufficiently close together to minimize thermal displacement of any given bond pad relative to any other bond pad.

2. A method of laying out bond pads on a semiconductor die according to claim 1, wherein:

the area of the sub-area is less than one half of the total area of the die.

3. A method of laying out bond pads on a semiconductor die according to claim 1, wherein:

the area of the sub-area is less than one third of the total area of the die.

4. A method of laying out bond pads on a semiconductor die according to claim 1, wherein:

the area of the sub-area is less than one fifth of the total area of the die.

5. A method of laying out bond pads on a semiconductor die according to claim 1, wherein:

the area of the sub-area is less than one tenth of the total area of the die.

6. A method of laying out bond pads on a semiconductor die according to claim 1, wherein:

the area of the sub-area is less than one fiftieth of the total area of the die.

7. A method of laying out bond pads on a semiconductor die according to claim 1, wherein:

the area of the sub-area is less than one hundredth of the total area of the die.

8. A method of laying out bond pads on a semiconductor die according to claim 1, wherein:

the sub-area includes an interior area of the die and a peripheral portion of the die.

9. A method of laying out bond pads on a semiconductor die according to claim 1, further comprising:

defining a ring-like peripheral area of the die on the planar surface along the edges of the planar surface; and defining an interior area of the die on the planar surface, said interior area enclosed by the peripheral area; wherein:

the sub-area is completely contained within the interior area of the die.

10. A method of laying out bond pads on a semiconductor die according to claim 1, wherein:

the sub-area is an elongated area;

the bond pads are disposed in two parallel rows along a longitudinal dimension of the elongated area.

11. Method, according to claim 1, further comprising:

determining locations for bond pads based on the position of underlying circuitry of the die;

defining desired locations for bond pads, the bond pads being provided at the desired locations, at least a portion of the desired locations differing from the determined locations; and providing conductive paths between the determined locations and the desired locations.

12. Method, according to claim 11, wherein:

the conductive paths are provided by existing conductive layers on the die.

13. Method, according to claim 11, wherein:

the conductive paths are provided by additional conductive layers on the die.

14. A semiconductor device assembly comprising:

a semiconductor die having a total area, a substantially planar surface, and edges of the planar surface;

a small, closed sub-area of the die on the planar surface having an area which is substantially smaller than the total area of the die; and bond pads disposed in the sub-area to minimize thermal displacement of any given bond pad relative to any other bond pad.

15. A semiconductor device assembly according to claim 14, further comprising: a plurality of conductive leads disposed in close proximity to the bond pads; and an electrical connection formed between each of the conductive leads and a corresponding bond pad.

16. A semiconductor device assembly according to claim 15, wherein:

the electrical connection is provided by a bond wire.

17. A semiconductor device assembly according to claim 15, wherein:

the electrical connection is provided by a solder-bump-type connection.

18. A semiconductor device assembly according to claim 14, wherein:

the sub-area includes an interior area of the die and a peripheral portion of the die.

19. A semiconductor device assembly according to claim 14, further comprising:

a ring-like peripheral area of the die defined on the planar surface along the edges of the planar surface; and an interior area of the die defined on the planar surface, said interior area enclosed by the peripheral area; wherein:

the sub-area is completely contained within the interior area of the die.

20. A semiconductor device assembly according to claim 14, wherein:

the sub-area is an elongated area;

the bond pads are disposed in two parallel rows along a longitudinal dimension of the elongated area.

21. A semiconductor device assembly according to claim 14, wherein:

the bond pads are disposed along a straight line, said straight line substantially laterally centered on the planar surface.

22. A semiconductor device assembly according to claim 14, wherein:

locations are determined for the bond pads based on the position of underlying circuitry of the die;

desired locations are defined for the bond pads, at least a portion of the desired locations differing from the determined locations;

the bond pads are disposed at the desired locations; and further comprising:

conductive paths disposed between the determined locations and the portion of the desired locations differing from the determined locations.

23. A semiconductor device assembly according to claim 22, wherein:

the conductive paths are provided by existing conductive layers on the die.

24. A semiconductor device assembly according to claim 22, wherein:

the conductive paths are provided by additional conductive layers on the die.

* * * * *